(12) United States Patent
Takao et al.

(10) Patent No.: US 10,187,057 B2
(45) Date of Patent: Jan. 22, 2019

(54) SEMICONDUCTOR MODULE, VEHICLE AND ELEVATOR

(71) Applicant: Kabushiki Kaisha Toshiba, Minato-ku (JP)

(72) Inventors: Kazuto Takao, Tsukuba (JP); Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 154 days.

(21) Appl. No.: 15/436,262

(22) Filed: Feb. 17, 2017

(65) Prior Publication Data

US 2018/0019750 A1    Jan. 18, 2018

(30) Foreign Application Priority Data

Jul. 12, 2016   (JP) .................. 2016-137392

(51) Int. Cl.
| H03K 17/687 | (2006.01) |
| H03K 5/02 | (2006.01) |
| H03K 5/135 | (2006.01) |
| H03K 17/284 | (2006.01) |
| B60L 11/18 | (2006.01) |
| B66B 11/04 | (2006.01) |

(52) U.S. Cl.
CPC .......... H03K 17/6871 (2013.01); H03K 5/02 (2013.01); H03K 5/135 (2013.01); B60L 11/18 (2013.01); B66B 11/04 (2013.01)

(58) Field of Classification Search
CPC ...... H03K 17/284; H03K 17/567; H03K 5/02; H03K 5/135; B60L 11/18; B66B 11/04
See application file for complete search history.

(56) References Cited

U.S. PATENT DOCUMENTS

| 7,551,004 B2 | 6/2009 | Okazaki et al. |
| 2014/0002141 A1 | 1/2014 | Barrenscheen et al. |
| 2017/0207782 A1* | 7/2017 | Takizawa ............. H03K 17/284 |

FOREIGN PATENT DOCUMENTS

| JP | 2003-70233 | 3/2003 |
| JP | 2006-238643 | 9/2006 |
| JP | 2009-153315 | 7/2009 |

(Continued)

OTHER PUBLICATIONS

Martin Schulz, et al., "Scalable high frequency converters for motor drives based on switching cells", 8th International Conference on Integrated Power Electronics Systems(CIPS2014), Feb. 2014, pp. 5.

(Continued)

*Primary Examiner* — Robert Deberadinis
(74) *Attorney, Agent, or Firm* — Oblon, McClelland, Maier & Neustadt, L.L.P.

(57) ABSTRACT

A semiconductor module of an embodiment includes a first switching device, a first gate drive circuit controlling ON/OFF of the first switching device, a second switching device connected with the first switching device in parallel or in series, a second gate drive circuit controlling ON/OFF of the second switching device, and a control circuit controlling timing of transmitting a gate drive signal from the first gate drive circuit and transmitting a gate drive signal from the second gate drive circuit by synchronizing the first gate drive circuit and the second gate drive circuit.

15 Claims, 6 Drawing Sheets

(56) References Cited

FOREIGN PATENT DOCUMENTS

| JP | 2010-142037 | 6/2010 |
| JP | 2013-13325 | 1/2013 |

OTHER PUBLICATIONS

Reinhold Bayerer, et al., "Low Impedance Gate Drive for full Control of Voltage Controlled Power Devices", 26th International Symposium on Power Semiconductor Devices & IC's(ISPSD2014), Jun. 2014, pp. 4.

* cited by examiner

SEMICONDUCTOR MODULE, VEHICLE AND ELEVATOR

CROSS-REFERENCE TO RELATED APPLICATION

This application is based upon and claims the benefit of priority from Japanese Patent Application No. 2016-137392, filed on Jul. 12, 2016, the entire contents of which are incorporated herein, by reference.

FIELD

Embodiments described herein relate to a semiconductor module, a vehicle and an elevator.

BACKGROUND

For example, a power semiconductor module such as power conversion module has a prominent effect that as a switching operation is faster, rise and fall of a signal are delayed due to a dull waveform of a gate drive signal caused by a parasitic inductance between a gate drive IC and a gate terminal of a switching device.

DETAILED DESCRIPTION

A semiconductor module of an embodiment includes a first switching device, a first gate drive circuit controlling ON/OFF of the first switching device, a second switching device connected with the first switching device in parallel or in series, a second gate drive circuit controlling ON/OFF of the second switching device, and a control circuit controlling timing of transmitting a gate drive signal from the first gate drive circuit and transmitting a gate drive signal from the second: gate drive circuit by synchronizing the first gate drive circuit and the second gate drive circuit.

Embodiments according to the present invention will be described below with reference to the drawings. In the following description, the same members and the like are denoted with the same reference numerals, and description of once-described members will be omitted as needed.

First Embodiments

A semiconductor module 100 according to a first embodiment comprises a first switching device Q1, a first gate drive circuit C1 for controlling ON/OFF of the first switching device Q1, a second switching device Q2 connected to the first switching device Q1 in parallel or in series, a second gate drive circuit C2 for controlling ON/OFF of the second switching device Q2, and a control circuit C3 for controlling timing of transmitting a gate drive signal from the first gate drive circuit C1 and transmitting a gate drive signal from the second gate drive circuit C2 by synchronizing the first gate drive circuit C1 and the second gate drive circuit C1.

Figure 1:
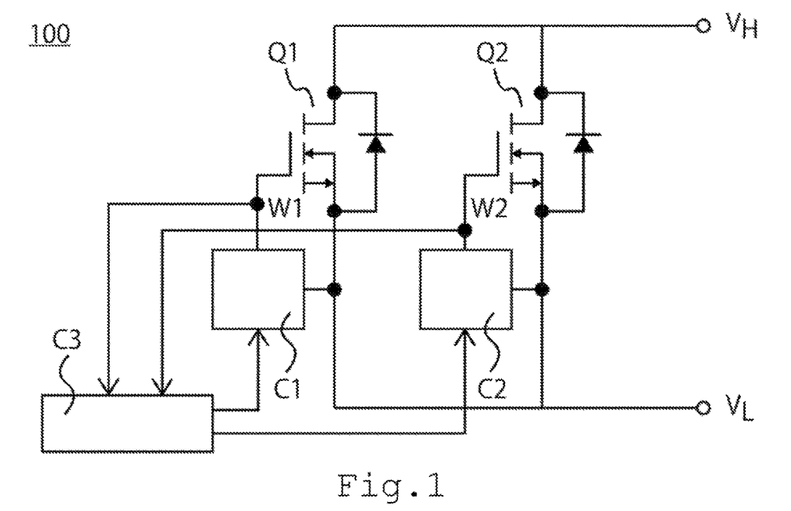
FIG. 1 is a circuit diagram of a semiconductor module according to a first embodiment.

FIG. 1 is a circuit diagram of the semiconductor module 100 according to the first embodiment. The semiconductor module 100 of FIG. 1 is a semiconductor module called intelligent power modular and includes the first switching device Q1 and the second switching device Q2 connected in parallel, the first gaffe drive circuit C1 connected to the first switching device Q1, the second gate drive circuit C2 connected to the second switching device Q2, and the control circuit C3 connected to the first gate drive circuit C1 and the second gate drive circuit C2. In FIG. 1, high potential side and low potential side are indicated as $V_H$ and $V_L$, respectively. FIG. 1 and others illustrate a form in which two switching devices are connected in parallel, but the gate drive circuits perform similar control also in a form in which three or more switching devices are connected in parallel, not limited to the above.

Figure 2:
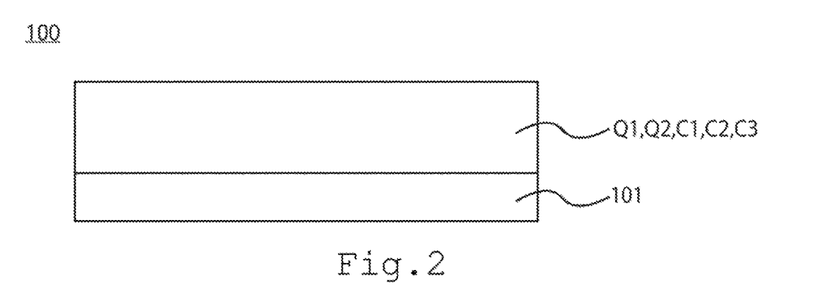
FIG. 2 is a schematic cross-section view of the semiconductor module according to the first embodiment.

FIG. 2 is a schematic diagram of the semiconductor module 100 according to the first embodiment. The first switching device Q1, the second switching device Q2, the first gate drive circuit C1, the second gate drive circuit C2, and the control circuit C3 are provided on a substrate 101. For example, each device or each circuit is connected in a circuit on the substrate. More specifically, the first switching device Q1, the second switching device Q2, the first gate drive circuit C1, and the second gate drive circuit C2 may be provided in the same region and the control circuit C3 may be separated and provided in a different region therefrom.

The first switching device Q1 is a semiconductor device connected to the second switching device Q2 in parallel or in series. The first switching device Q1 and the second switching device Q2 are IGBT (Insulated Gate Bipolar Transistor) or wide-bandgap MOSFET (Metal Oxide Semiconductor Field Effect Transistor). Specifically, the wide-bandgap MOSFET may be MOSFET made of any one of SiC (silicon oxide), GaN (gallium nitride), $Ga_2O_3$ (thallium oxide), and diamond. A plurality of switching devices are preferably connected in parallel or in series in order to enhance withstand voltage and current capacity of a circuit. FIG. 1 illustrates a circuit using n-type MOSFETs, but the switching devices are not limited to n-type MOSFETs. Diodes of the first switching device Q1 and the second switching device Q2 in FIG. 1 indicate parasitic diodes. Free wheeling diodes may be provided in parallel for the switching devices.

A gate terminal of the first switching device Q1 is connected to the first gate drive circuit C1. More specifically, the gate terminal of the first switching device Q1 is connected to a signal output terminal of the first gate drive circuit C1.

A gate terminal of the second switching device Q2 is connected to the second gate drive circuit C2. More specifically, the gate terminal of the second switching device Q2 is connected to a signal output terminal of the second gate drive circuit C2. The first gate drive circuit C1 and the second gate drive circuit C2 are physically independent circuits, and independently transmit a gate drive signal.

The first gate drive circuit C1 is directed for controlling ON/OFF of the first switching device Q1. The first gate drive circuit C1 includes at least a circuit for amplifying a received signal. The first gate drive circuit C1 receives and amplifies a first control signal S1 transmitted from the control circuit C3 and transmits a first gate drive signal S2 to the gate terminal of the first switching device Q1. The first gate drive circuit C1 is connected to $V_L$ of the first switching device Q1. Further, the first gate drive circuit C1 is connected to the control circuit C3 and the first gate drive signal S2 is transmitted also to the control circuit C3.

The second gate drive circuit C2 is similar to the first gate drive circuit C1. The second gate drive circuit C2 also includes at least a circuit for amplifying a received signal. The second gate drive circuit C2 transmits a signal for controlling ON/OFF of the second switching device Q2. The second gate drive circuit C2 receives and amplifies a second control signal S3 transmitted from the control circuit C3, and transmits a second gate drive signal S4 to the gate terminal of the second switching device Q2. The second gate drive circuit C2 is preferably configured of a similar integrated circuit to the first gate drive circuit C1, for example. The second gate drive circuit C2 is connected to $V_L$ of the second switching device Q2. The second gate drive circuit C2 is connected to the control circuit C3 and the second gate drive signal S4 is transmitted also to the control circuit C3.

A first connection wiring W1 between the first switching device Q1 and the first gate drive circuit C1 and a second connection wiring W2 between the second switching device Q2 and the second gate drive circuit C2 are preferably short. As parasitic inductances of the wirings are lower, a rise time and a fall time of an ON/OFF signal from a gate drive circuit are shorter, which is preferable in terms of higher switching frequency. The embodiment does not employ a configuration in which one gate drive circuit controls a plurality of switching devices, thereby reducing the parasitic inductances while restricting variations in the parasitic inductances.

The first gate drive circuit C1 and the second gate drive circuit C2 are physically independent, thereby making a distance between a gate drive circuit and a gate terminal shorter and reducing the lengths of the connection wirings. For example, when there is configured such that one gate drive circuit controls ON/OFF of the gate of the two switching devices, the connection wirings to the gate terminals of the two switching devices are longer, or the connection wiring to one switching device is shorter and the connection wiring to the other switching device is longer. Therefore, an increase in parasitic inductances is problematic when one gate drive circuit controls two switching device in terms of the distances between the gate drive circuit and the switching devices.

The semiconductor module 100 according to the embodiment comprises a plurality of configurations in which one gate drive circuit and one switching device are paired (two pairs in FIG. 1). With the configurations, a wiring length between the gate terminal of the switching device and the signal output terminal of the gate drive circuit can be shortened in each pair. A difference in wiring length between the pairs can be reduced, and substantially eliminated. Thus, a first parasitic inductance L1 of the first connection wiring W1 and a second parasitic inductance L2 of the second connection wiring W2 are preferably 100 nH or less. A difference between the first parasitic inductance L1 and the second parasitic inductance L2 is preferably 10% or less.

The first parasitic inductance L1 and the second parasitic inductance L2 are preferably 60 nH or less and a difference between the first parasitic inductance L1 and the second parasitic inductance L2 is preferably 10% or less in order to achieve a rise time and a fall time due to gate drive to be 30 ns or less. Further, the first parasitic inductance L1 and the second parasitic inductance L2 are preferably 15 nH or less and a difference between the first parasitic inductance L1 and the second parasitic inductance L2 is preferably 10% or less in order to achieve a rise time and a fall time due to gate drive to be 10 ns or less.

A time-lag of a dozen ns to several tens ns is present after the gate drive circuit receives a control signal until it outputs a gate drive signal. An error of a dozers ns to several tens ns is caused even in the gate drive circuits configured with the same circuit. Thus, even if the parasitic inductances are reduced, a rise time and a fall time due to gate drive may not be shortened due to an error between the first gate drive circuit C1 and the second gate drive circuit C2, which is problematic in terms of higher switching frequency.

The control circuit C3 is directed for controlling the first gats drive circuit C1 and the second gate drive circuit C2 to synchronize with each other and to output a gate drive signal. The control circuit C1 controls timing of transmitting a gate drive signal from the first gate drive circuit C1 and transmitting a gate drive signal from the second gate drive circuit C2 by synchronizing the first gate drive circuit C1 and the second gate drive circuit C1. The control circuit C3 includes at least a circuit for transmitting a signal, a storage circuit for storing a signal time, and a calculation circuit for making calculations. The control circuit C3 connects the first gate drive circuit C1 with the signal input terminal of the second gate drive circuit C2, controls adjusting a transmitting time of the first control signal S1 and a transmitting time of the second control signal S3, and synchronizing the first gate drive signal S2 and the second gate drive signal in order to transmit a control signal to the gate drive circuits. The control circuit C3 transmits the first control signal S1 to the first gate drive circuit C1 and transmits the second control signal S3 to the second gate drive circuit C2.

Figure 3:
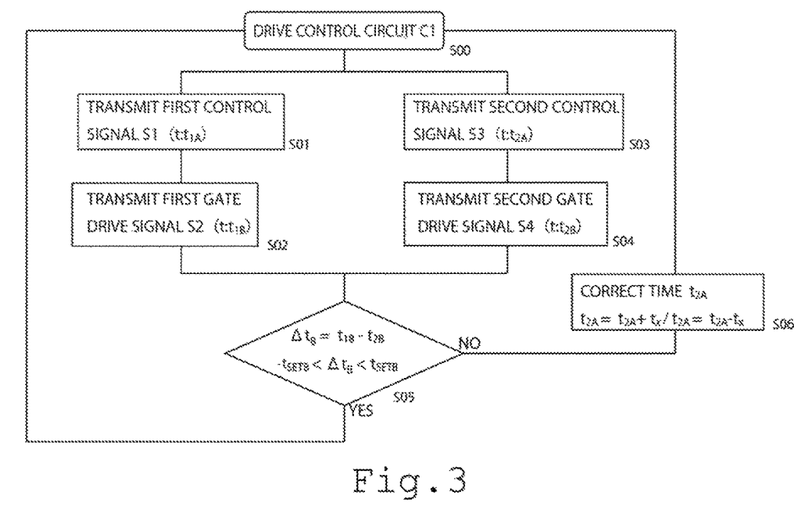
FIG. 3 is a flowchart illustrating a method for controlling the semiconductor module according to the first embodiment.

ON/OFF control of the switching devices will be described with reference to the flowchart of FIG. 3. At first the control circuit C3 is started (S00), and the first control signal S1 is transmitted from the control circuit C3 to the first gate drive circuit C1 at time $t_{1A}$ (S01). Then, the first gate drive circuit C1 receiving the first control signal S1 amplifies the signal, and transmits the first gate drive signal S2 for controlling ON/OFF of the first switching device Q1 to the first switching device Q1 and the control circuit C3 at time $t_{1B}$ (S02). The second control signal S3 is transmitted from the control circuit C3 to the second gate drive circuit C2 at time $t_{2A}$ (S03). Then, the second gate drive circuit C2 receiving the second control signal S3 amplifies the signal, and transmits the second gate drive signal S4 for controlling ON/OFF of the second switching device Q2 to the second switching device Q2 and the control circuit C3 at time $t_{2B}$ (S04). Then, a determination is made as to whether a difference between a time when the first gate drive signal S2 is transmitted and a time when the second gate drive signal S4 is transmitted, which are set in the control circuit C3, is within a set range, and when it is within the range, steps S01 to S04 are repeatedly performed again (S05). When a difference between a time when the first gate drive signal S2 is transmitted and a time the second gate drive signal S4 is transmitted is outside the set range, time $t_{2A}$ is corrected, and steps S01 to S04 are repeatedly performed again (S06).

The control circuit C3 finds $\Delta t_B$ in the equation of $\Delta t_B = T_{1B} - t_{2B}$. Then it determines whether $-t_{SETB} < \Delta t_B < t_{SETB}$ is met (S07). $t_{SETB}$ is a set value and is a permitted value set for a difference between a time when the first gate drive signal S2 is transmitted and a time when the second gate drive signal S4 is transmitted, which are set in the control circuit C3. $t_{SETB}$ is preferably 30 ns or less, and snore preferably 10 ns or less. When the condition $(-t_{SETB}<\Delta t_B<t_{SETB})$ is met (YES), a difference between a time when the first gate drive signal S2 is transmitted and a time when the second gate drive signal S4 is transmitted is small. The calculation is made in the control circuit C3.

Further, when the condition $(-t_{SETB}<\Delta t_B<t_{SETB})$ is not met (NO), a temporal correction by correction time $t_x$ is made on time $t_{2A}$. Correction time $t_x$ is added to time $t_{2A}$ $t_{2A}=t_{2A}+t_x$) or subtracted therefrom ($t_{2A}=t_{2A}-t_x$) to correct time $t_{2A}$, thereby adjusting a difference between a time when the first control signal S1 is transmitted and a time when the second control signal S3 is transmitted. Consequently, a difference between a time when the first gate drive signal S2 is transmitted and a time when the second gate drive signal S4 is transmitted is adjusted, and corrected $\Delta t_B$ meets $-t_{SETB}<\Delta t_B<t_{SETB}$. Correction time $t_x$ is at $\Delta t_B-t_{SETB} \leq t_x \leq \Delta t_B+t_{SETB}$. The calculation is made in the control circuit C3. In summary, the control circuit C3 calculates whether $-t_{SETB}<\Delta t_B<t_{SETB}$ is met assuming t$\Delta t_B$ at $\Delta t_B=t_{1B}-t_{2B}$ and a set value of a temporal difference between the first gate drive signal S2 and the second gate drive signal S4 at $t_{SETB}$, and when $\Delta t_B$ does not meet $-t_{SETB}<\Delta t_B<t_{SETB}$, the control circuit C3 makes a temporal correction by $t_x$ on time $t_{2A}$ assuming correction time $t_x$ at $\Delta t_B-t_{SETB} \leq t_x \leq \Delta t_B+t_{SETB}$, and corrected $\Delta t_B$ meets $-t_{SETB}<\Delta t_B<t_{SETB}$.

A difference between a time when the first gate drive signal S2 is transmitted and a time when the second gate drive signal S4 is transmitted changes due to a condition such as temperature, and it is preferable that a difference between a time when the first gate drive signal S2 is transmitted and a time when the second gate drive signal S4 is transmitted is found at any intervals, not only once, so that the first gate drive circuit C1 and the second gate drive circuit C2 synchronize with each other thereby to output a gate drive signal (in a loop in the Figure). A correction is made such that $\Delta t_B$ is smaller than $\pm t_{SETB}$ under a specific condition at any intervals while the semiconductor module according to the embodiment is operating, thereby controlling a change in rise time and fall time due to gate drive during the operation of the module. Even a small change in operation condition can influence the time in order to achieve a rise time and a fall time due to gate drive to be 30 ns, or 10 ns or less. The module according to the embodiment is suitable since it can cope with an over-time or thermal change.

When the first gate drive circuit C1 and the second gate drive circuit C2 synchronize with each other to output a gate drive signal, the first switching device Q1 and the second switching device Q2 switch ON or OFF simultaneously or almost simultaneously. Thus, either switching device is prevented from being ON, and thus the devices are difficult to break. Further, the first switching device Q1 and the second switching device Q2 switch ON or OFF simultaneously or almost simultaneously, and thus a rise time and a fall time due to gate drive of the circuit including the first switching device Q1 and the second switching device Q2 connected in parallel can be reduced. The rise time and the fall time due to gate drive of the circuit are preferably 30 ns or less, and more preferably 10 ns or less since the switching frequency is increased to 50 kHz or more, for example.

The rise time and the fall time of the circuit including the first switching device Q1 and the second switching device Q2 connected in parallel are found as follows. The rise time and the fall time are a time after time $t_B$ when a gate drive signal is earlier transmitted until a time when the $V_L$ potential at which the switching devices switch ON or OFF enters a steady state during ON or OFF.

It is preferable that there is not a wiring connecting the first connection wiring W1 and the second connection wiring When such a wiring is present, a gate drive signal passes through the wiring, and thus an earlier-transmitted gate drive signal drives a plurality of switching devices. Then, parasitic inductances are increased and a variation is caused. Further, when the first connection wiring W1 and the second connection wiring W2 are connected with each other, the first gate drive signal S2 flows through the second gate drive circuit C2, and thus if can be a source of noises for the second gate drive circuit C2. Similarly, the second gate drive signal S4 can be a source of noises for the first gate drive circuit C1, and thus it is preferable that a wiring connecting the first connection wiring W1 and the second connection wiring W2 is not present.

The description has been made assuming that a gate drive signal is directed for switching ON or OFF the switching devices, and a temporal difference between the first gate drive signal S2 and the second gate drive signal S4 has only to be adjusted. Therefore, the gate drive signals may be conducted at as low a voltage as not switching ON or OFF the switching devices, and may be controlled to be synchronized.

According to the embodiment, active gate drive for adjusting a temporal difference between the first gate drive signal S2 and the second gate drive signal S4 by calculations is enabled. A temporal difference including a temporal difference caused by heat or the like during operation can be corrected unlike passive control for physically providing a delay circuit and adjusting a delay of signal. The passive control can adjust a designed value, but cannot correct an error of IC of the circuit, for example.

The gate drive signals are compared with each other thereby to detect a difference in property be ween the switching devices. When a difference in property between the switching devices is detected, a temporal difference between the first gate drive signal S2 and the second gate drive signal S4 may be adjusted to compensate for the difference in property between the first switching device Q1 and the second switching device Q2.

Also when the switching devices are connected in series, the first gate drive circuit C1 and the second gate drive circuit C2 may be controlled by the control circuit C3 to synchronize with each other thereby to output a gate drive signal like when they are connected in parallel. When they are connected in series, a temporal difference is caused between the gate drive signals, and when a temporal difference in ON/OFF between the switching devices is caused, a high voltage is applied to a switching device rising later, and a high voltage is applied to a switching device falling earlier. When the rise time and the fall time are longer, an effect of the applied high voltage is small, but switching is performed at a high frequency according to the embodiment and the switching devices can be broken due to a conventionally-trivial error, and thus the first gate drive circuit C1 and the second gate drive circuit C2 synchronize with each other thereby to output a gate drive signal.

The two switching devices are connected in parallel or in series according to the embodiment, but when three or more switching devices are connected, a temporal difference between the gate drive signals is adjusted in a similar way to the above, and a rise time and a fall time due to gate drive of a circuit including the switching devices connected in parallel or in series is adjusted.

The semiconductor module 100 according to the embodiment may be provided with a temperature sensor, an ammeter, a voltmeter, a circuit for transmitting information on the semiconductor module 100, a circuit for controlling the operations of the circuits, and the like. A configuration for monitoring and controlling the operations of the semiconductor module is preferable. The transmission circuit and the like can be connected with an apparatus outside the semiconductor module 100 in a wired manner (such as wired LAN, USB or serial connection) or can make digital wireless communication (such as Wi-Fi or Bluetooth™ therewith.

Second Embodiment

Figure 4:
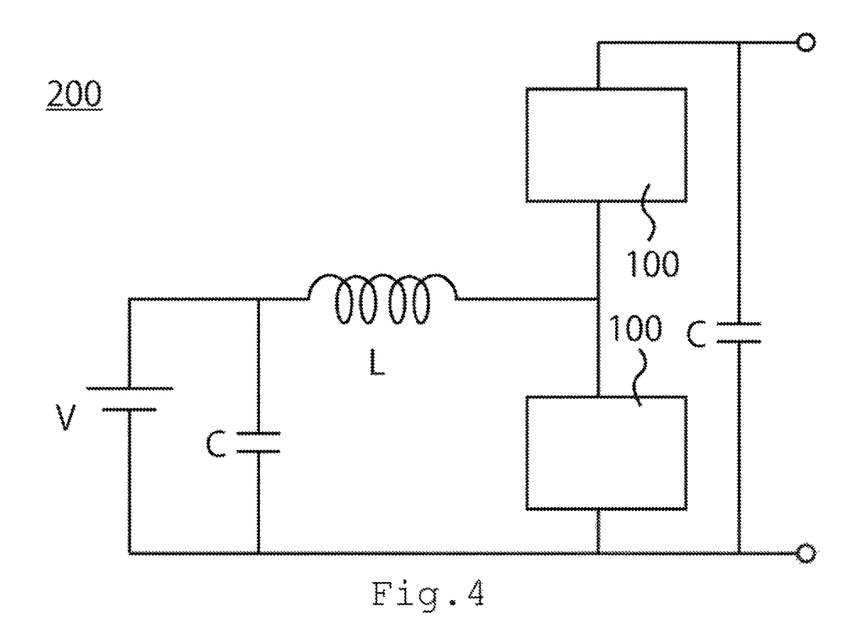
FIG. 4 is a circuit diagrams of a semiconductor module according to a second embodiment.

A second embodiment is for a semiconductor module 200 having a booster circuit using the semiconductor module 100 according to the first embodiment. FIG. 4 is a circuit diagram of the semiconductor module 200 according to the second embodiment. FIG. 4 illustrates a circuit in which the semiconductor module 100 according to the first embodiment is used for a booster chopper circuit, which is configured of a DC power supply V, a reactor L, a capacitor C, and the semiconductor module 100. The semiconductor module 100 according to the first embodiment is used for a booster circuit, which is advantageous in that a switching frequency is increased, the reactor L is reduced, and the semiconductor module 200 is downsized. A schematic cross-section diagram of the semiconductor module 200 according to the second embodiment may employ a similar configuration to the schematic diagram of FIG. 2.

Third Embodiment

Figure 5:
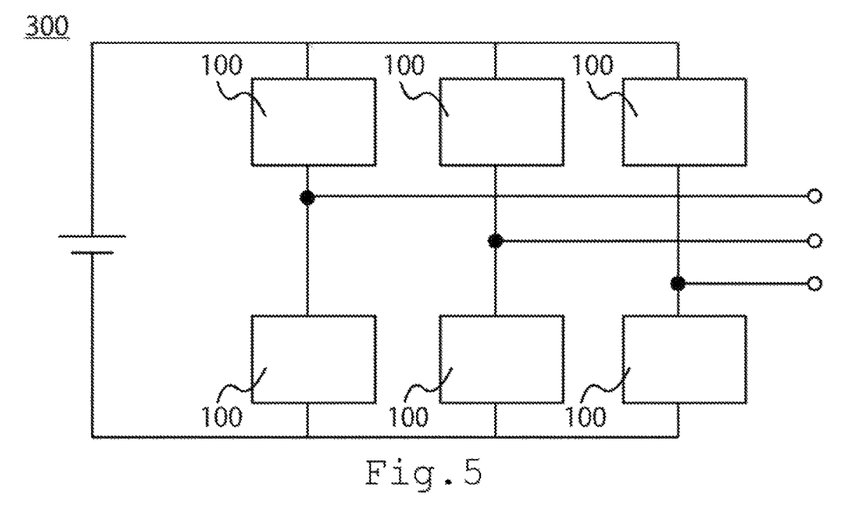
FIG. 5 is a circuit diagram of a semiconductor module according to a fourth embodiment.

A third embodiment is for a semiconductor module 300 having an inverter circuit using the semiconductor module 100 according to the first embodiment. FIG. 5 is a circuit diagram of the semiconductor module 300 according to the third embodiment. FIG. 5 illustrates a circuit in which the semiconductor module 100 according to the first embodiment is used for a full-bridge three-phase inverter circuit, which is configured of the DC power supply V, the capacitor C, and the semiconductor module 100. An increase in switching frequency has an advantage of reduced noises. A schematic cross-section diagram of the semiconductor module 300 according to the third embodiment can employ a similar configuration to the schematic diagram of FIG. 3. The semiconductor module 100 according to the first embodiment is employed for an inverter circuit, which is advantageous in that the devices are difficult to break and noises are restricted.

Fourth Embodiment

Figure 6:
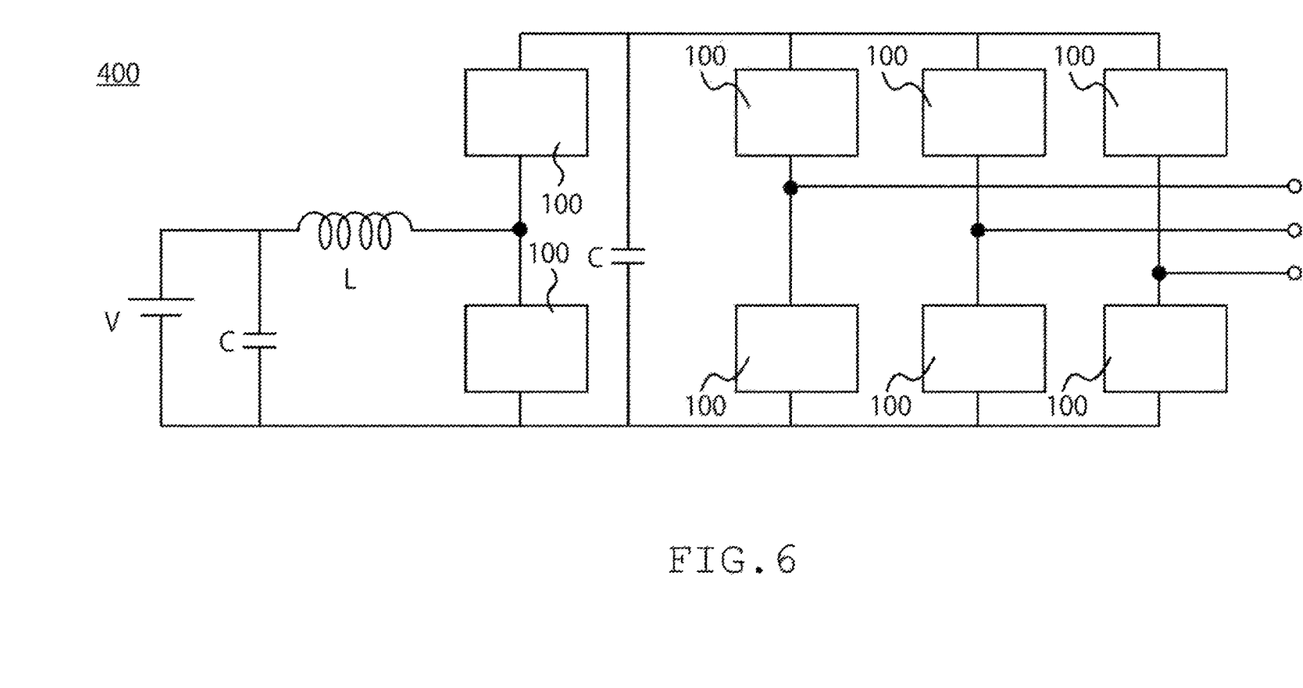
FIG. 6 is a circuit diagram of a semiconductor module according to a fourth embodiment.

A fourth embodiment is for a semiconductor module 400 having a booster circuit and an inverter circuit both using the semiconductor module 100 according to the first embodiment. FIG. 6 is a circuit diagram of the semiconductor module 400 according to the fourth embodiment. FIG. 6 illustrates a circuit for AC-converting a DC power supply boosted in the booster chopper circuit by the full-bridge three-phase inverter circuit, which has a configuration in a combination of the booster circuit according to the second embodiment and the three-phase inverter circuit according to the third embodiment. A schematic cross-section diagram of the semiconductor module 400 according to the fourth embodiment may employ a similar configuration to the schematic diagram of FIG. 2. The semiconductor module 100 according to the first embodiment is employed for a booster circuit and an inverter circuit, which is advantageous in that the devices are difficult to break, the module is downsized, and noises are restricted.

Fifth Embodiment

Figure 7:
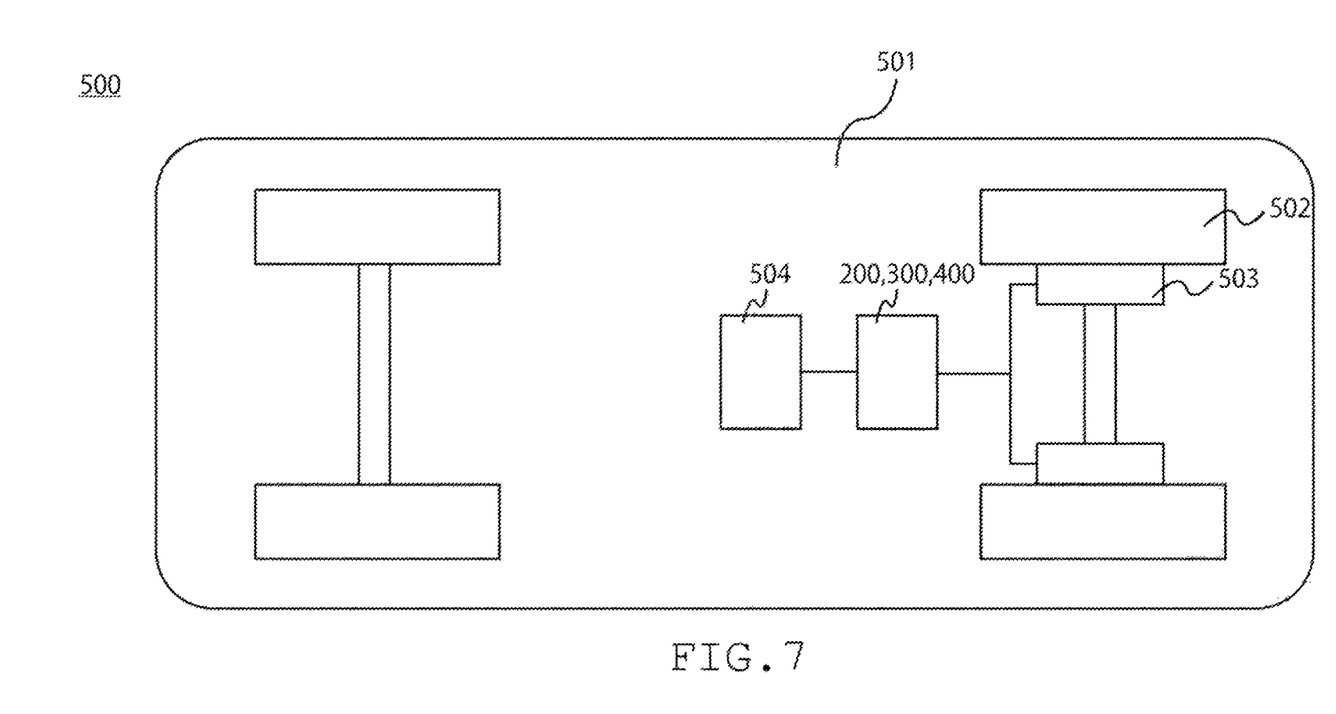
FIG. 7 is a schematic diagram of a vehicle according to a fifth embodiment.

A fifth embodiment is for a vehicle 500 using the semiconductor module 200 having a booster circuit, the semiconductor module 300 having an inverter circuit, or the semiconductor module having a booster circuit and an inverter circuit. The vehicle 500 includes both a power-assisted vehicle and a hybrid vehicle having an internal engine. Specific examples of the vehicle 500 are automobiles, trains, and the like. The vehicle 500 illustrated in the schematic diagram of FIG. 7 includes the semiconductor modules 200, 300, and 400, a vehicle body 501, wheels 502, motors 503 for driving the wheels 502, and a power supply 504. The motors 503 are driven by AC voltage supplied from the inverter circuit to rotate the wheels, thereby moving the vehicle. The power supply 504 may be a secondary battery or fuel battery. A semiconductor module according to any embodiment may be employed for a configuration in which the motors are rotated and electricity converted by the inverter circuit is charged in the secondary battery while the vehicle is decelerating. A plurality of inverter circuits may be provided and employed for the inverter circuit semiconductor modules 300 and 400 for driving a motor (not illustrated) for operating the inverter circuit for driving the motors 503 and the electronic devices in the vehicle. The semiconductor modules according to the embodiments are employed, which is advantageous in that the devices are difficult to break, the modules are downsized, and noises are restricted during AC conversion.

Sixth Embodiment

Figure 8:
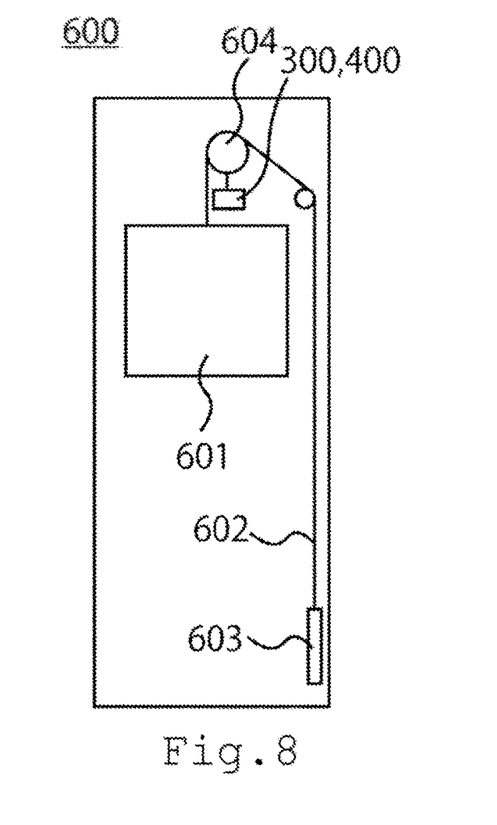
FIG. 8 is a schematic diagram of an elevator according to a sixth embodiment.

A sixth embodiment is for an elevator 600 using the semiconductor module 300 having an inverter circuit or the semiconductor module 400 having a booster circuit and an inverter circuit. An elevator 600 illustrated in the schematic diagram of FIG. 8 includes a cage 601, a rope 602, a counterweight 603, a motor 604, and the semiconductor modules 300 and 400. The rope 602 connects the cage 601 and the counterweight 603, and drives the modules 604 by AC voltage supplied from the semiconductor modules 300 and 400 thereby to vertically move the cage 601. The use of the semiconductor modules 300 and 400 is advantageous in that the devices are difficult to beak, the modules are downsized, and noises are restricted.

The fifth and sixth embodiments have been described assuming that the semiconductor devices according to the present invention are applied to a vehicle or an elevator, but the semiconductor devices according to the present invention can be applied to power conditioner in a solar power system.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor module comprising:
   a first switching device;
   a first gate drive circuit controlling ON/OFF of the first switching device;
   a second switching device connected with the first switching device in parallel or in series;
   a second gate drive circuit controlling ON/OFF of the second switching device; and
   a control circuit controlling timing of transmitting a gate drive signal from the first gate drive circuit and transmitting a gate drive signal from the second gate drive circuit by synchronizing the first gate drive circuit and the second gate drive circuit.

2. The module according to claim 1,
   wherein the first gate drive circuit transmits a first gate drive signal to the first switching device,
   the second gate drive circuit transmits a second gate drive signal to the second switching device, and
   the control circuit controls the first gate drive circuit and the second gate drive circuit no synchronize a transmitting time of the first gate drive signal with a transmitting time of the second gate drive signal.

3. The module according to claim 1,
   wherein the control circuit transmits a first control signal to the first gate drive circuit,
   the control circuit transmits a second control signal to the second gate drive circuit,
   the first gate drive circuit amplifies the first control signal and transmits a first gate drive signal to the first switching device,
   the second gate drive circuit amplifies the second control signal and transmits a second gate drive signal to the second switching device, and
   the control circuit adjusts a difference between a time to transmit the first control signal and a time to transmit the second control signal to synchronize a transmitting time of the first gate drive signal with a transmitting time of the second gate drive signal.

4. The module according to claim 3,
   wherein a difference between the transmitting time of the first gate drive signal and the transmitting time of the second gate drive signal is 30 ns or less.

5. The module according to claim 3,
   wherein a difference between the transmitting time of the first gate drive signal with the transmitting time of the second gate drive signal is 10 ns or less.

6. The module according to claim 1,
   wherein the control circuit transmits a first control signal to the first gate drive circuit at time $t_{1A}$,
   the control circuit transmits a second control signal to the second gate drive circuit at time $t_{2A}$,
   the first gate drive circuit transmits a first gate drive signal to the first switching device at time $t_{1B}$,
   the first gate drive circuit transmits a second gate drive signal to the second switching device at time $t_{2B}$,
   the control circuit calculates whether $-t_{SETB} < \Delta t_B < t_{SETB}$ is met assuming $\Delta t_B$ at $\Delta t_B = t_{1B} - t_{2B}$, and a set value of a temporal difference between the first gate drive signal and the second gate drive signal at $t_{SETB}$,
   when $\Delta t_B$ does not meet $-t_{SETB} < \Delta t_B < t_{SETB}$,
   the control circuit makes a temporal correction by $t_x$ on time $t_{2A}$ assuming correction time $t_x$ at $\Delta t_B - t_{SETB} < \Delta t_x < \Delta t_B + t_{SETB}$, and
   corrected $\Delta t_B$ meets $-t_{SETB} < \Delta t_B < t_{SETB}$.

7. The module according to claim 1,
   wherein a first parasitic inductance of a first connection wiring between the first switching device and the first gate drive circuit and a second parasitic inductance of a second connection wiring between the second switching device and the second gate drive circuit are 60 nH or less.

8. The module according to claim 1,
   wherein a difference between a first parasitic inductance of a first connection wiring between the first switching device and the first gate drive circuit and a second parasitic inductance of a second connection wiring between the second switching device and the second gate drive circuit is 10% or less.

9. The module according to claim 1,
   wherein a rise time and a fall time due to gate drive of a circuit including the first switching device and the second switching device connected in parallel or in series are 30 ns or less.

10. The module according to claim 1,
    wherein a rise time and a fall time due to gate drive of a circuit including the first switching device and the second switching device connected in parallel or in series are 10 ns or less.

11. A semiconductor module comprising: the semiconductor module according to claim 1, used as a module having a booster circuit.

12. A semiconductor module comprising: the semiconductor module according to claim 1 used as a module having an inverter circuit.

13. A semiconductor module comprising: the semiconductor module according to claim 1 is used as a module having a booster circuit and an inverter circuit.

14. A vehicle comprising: the semiconductor module according to claim 1.

15. An elevator comprising: the semiconductor module according to claim 1.

* * * * *